United States Patent [19]

Wires et al.

[11] 4,010,464
[45] Mar. 1, 1977

[54] MAGNETICALLY OPERATED REED SWITCH TYPE DIGITAL ENCODER

[75] Inventors: Harold O. Wires, Picayune, Miss.; Samuel E. Rickly, Slidell, La.

[73] Assignee: The United States of America as represented by the Secretary of the Interior, Washington, D.C.

[22] Filed: Oct. 21, 1975

[21] Appl. No.: 624,358

[52] U.S. Cl. .................. 340/347 P; 192/12 BA; 235/103; 250/231 SE

[51] Int. Cl.² ............. H03K 13/02; B60K 41/24; F16D 67/02

[58] Field of Search ........... 340/347 P; 192/12 BA; 235/92 C, 92 EA, 103; 250/231 SE

[56] References Cited

UNITED STATES PATENTS

| | | | |
|---|---|---|---|
| 3,087,587 | 4/1963 | Flieg | 192/12 BA X |
| 3,115,217 | 12/1963 | Butler | 192/12 BA X |
| 3,268,712 | 8/1966 | Lee et al. | 235/92 C |
| 3,373,851 | 3/1968 | Baer | 192/12 BA |
| 3,721,806 | 3/1973 | Stothart | 235/92 C X |
| 3,798,634 | 3/1974 | Kamada | 340/347 P |
| 3,837,450 | 9/1974 | Malion et al. | 192/12 BA |
| 3,931,705 | 1/1976 | Iwaki et al. | 235/103 |

*Primary Examiner*—Thomas J. Sloyan
*Attorney, Agent, or Firm*—Gersten Sadowsky; Donald R. Fraser

[57] ABSTRACT

A shaft position digitizer has a jump transfer assembly coupling an input shaft to cams for moving magnet-carrying levers to provide discrete step-by-step operation and eliminate least significant digit ambiguity. A magnetically operated reed switch is aligned with the magnet carried by each lever such that the reed switches are opened and closed by movement of the levers to provide an electrical digital output representative of input shaft rotation.

2 Claims, 6 Drawing Figures

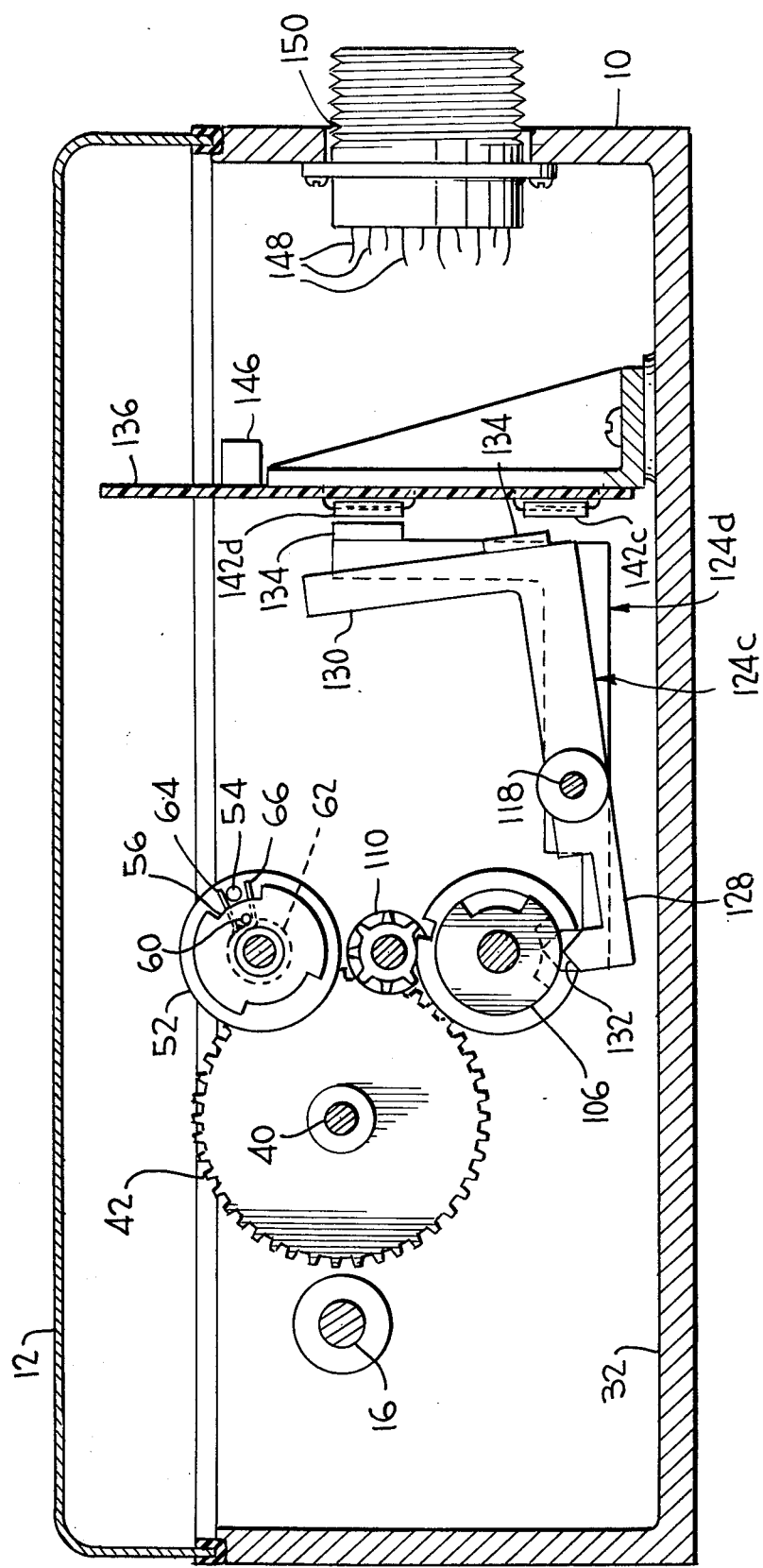

MAGNETICALLY OPERATED REED SWITCH TYPE DIGITAL ENCODER

BACKGROUND OF THE INVENTION

1. Field of the Invention

The present invention pertains to a conversion of shaft rotation to digital form and, more particularly, to a shaft position digitizer providing an output suitable for multiparameter digital recording.

2. Discussion of the Prior Art

High speed shaft position or rotation digitizers are commercially available; however, such shaft position digitizers have been relatively costly and frequently require external power as well as generally having low resolution. U.S. Pat. No. 2,972,740 is exemplary of prior art shaft position digitizers using commutator and brush structure while U.S. Pat. No. 3,497,682 is exemplary of attempts to simplify shaft rotation counting using a rotating magnet to operate a plurality of circumferentially arranged reed switches.

Generally, prior art shaft position or rotation encoders, particularly those providing a digital output, have suffered the disadvantages of having complex sructure in order to provide accurate conversion and of being relatively expensive to produce.

SUMMARY OF THE INVENTION

Accordingly, it is a primary object of the present invention to overcome the disadvantages of the prior art by providing an economical shaft position digitizer for accurate conversion of shaft rotation to digital form with high resolution and an output suitable for multiparameter digital recording.

Another object of the present invention is to utilize a purely mechanical jump transfer assembly to eliminate least significant digit ambiguity in a shaft position digitizer.

The present invention has a further object in the use of magnetically operated reed switches to produce a digital output representative of shaft position or rotation with reduced magnetic cross talk to increase output accuracy.

An additional object of the present invention is to convert shaft rotation to digital form by rotating a plurality of cams in accordance with rotation of an input shaft to move a plurality of magnet-carrying levers in a binary coded decimal manner and operate a plurality of reed switches, each reed switch being aligned with a magnet carried by one of the levers.

Some of the advantages of the present invention over the prior art are that the shaft position digitizer of the present invention is inexpensive to produce, provides bidirectional operation with a visual readout as well as an electrical digital output and requires no external electrical power and that the shaft position digitizer of the present invention is in a standby interrogate mode at all times without least significant digit ambiguity.

The present invention is generally characterized in a shaft position digitizer including a rotatable input shaft, magnetically operated reed switches for providing an electrical digital output representative of rotation of the input shaft, magnets movable to operate the reed switches, means for moving the magnets in accordance with rotation of the input shaft, and a jump transfer assembly having a lost motion mechanism for producing a jump advance of the magnet moving means in response to a predetermined rotation of the input shaft whereby least significant digit ambiguity in the digital output is eliminated.

Other objects and advantages of the present invention will become apparent from the following description of the preferred embodiment taken in conjunction with the accompanying drawings.

BRIEF DESCRIPTION OF THE DRAWINGS

FIG. 3 is a section taken along line 3—3 of FIG. 2.

BRIEF DESCRIPTION OF THE PREFERRED EMBODIMENT

Figure 1:
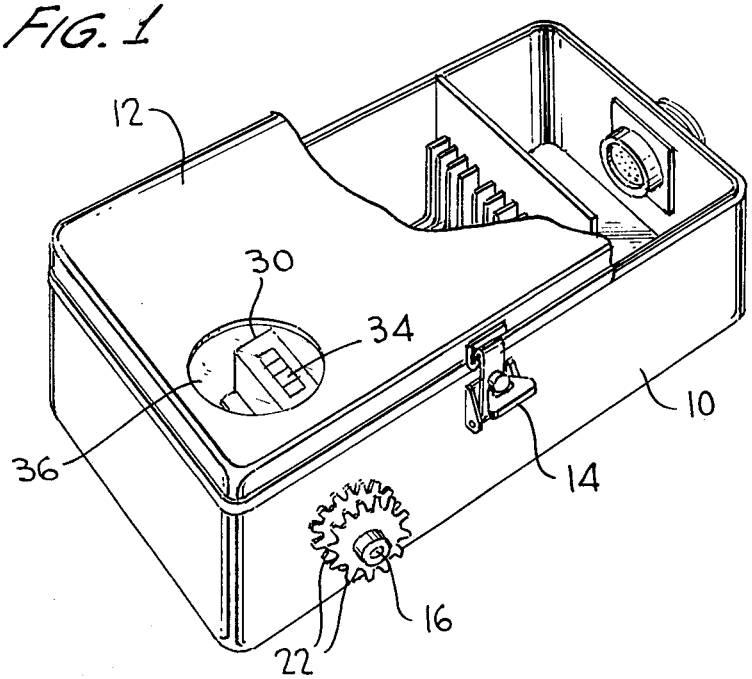
FIG. 1 is a perspective view with parts broken away of a shaft position digitizer according to the present invention.
Figure 2:
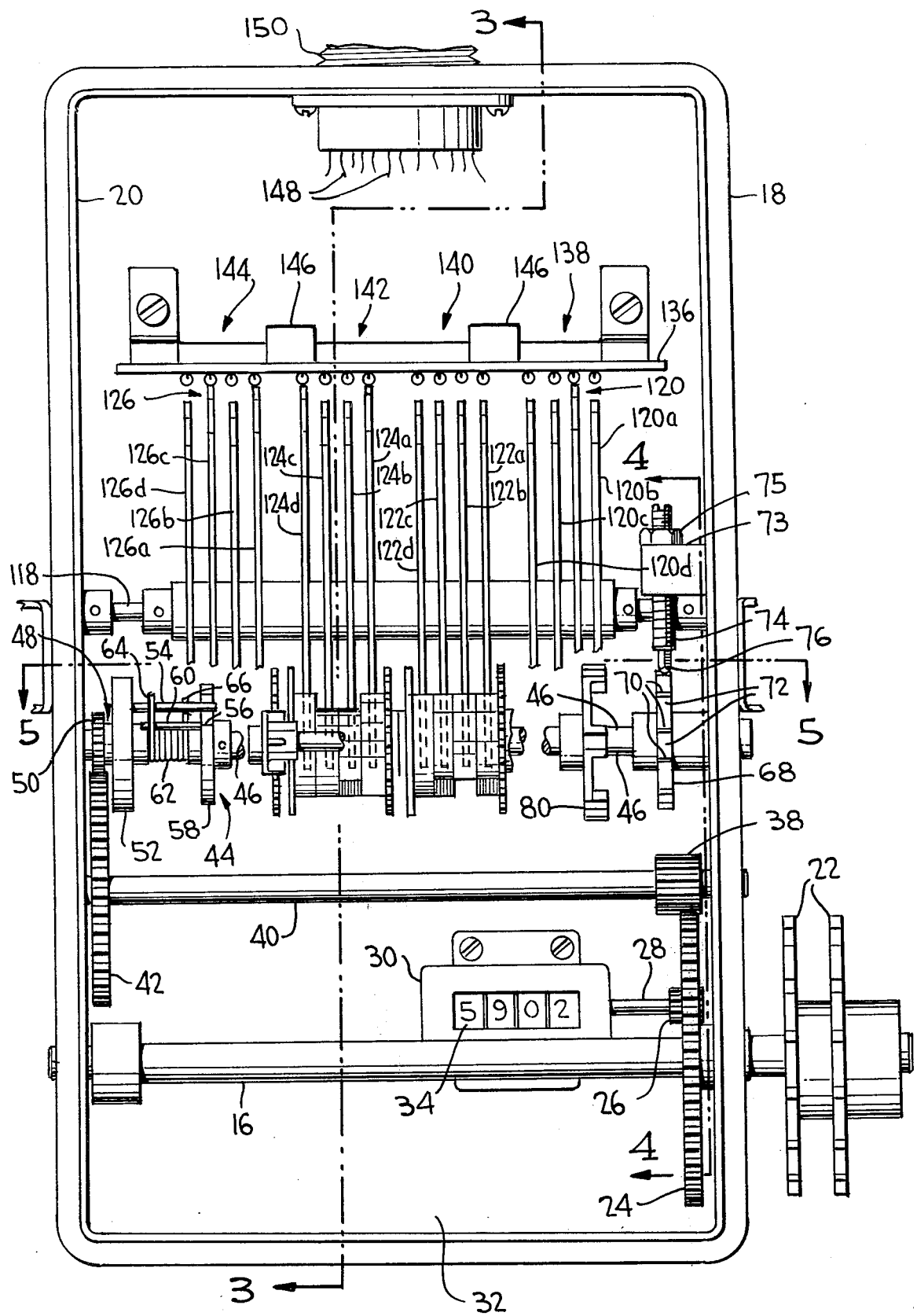
FIG. 2 is a top plan view of the shaft position digitizer of the present invention.

A shaft position digitizer according to the present invention is shown in FIGS. 1 and 2 and includes a case 10 having a cover 12 secured on the case by latches 14 on either side of the case. An input shaft 16 is journaled in side walls 18 and 20 of case 10 and has sprockets 22 secured thereto externally of the case to be driven via a suitable chain or belt from a shaft, not shown, to be measured. A large gear 24 is fixed to input shaft 16 adjacent wall 18 of the case 10 and meshes with a small gear 26 fixed to a shaft 28 driving a conventional mechanical counter 30 secured to a bottom wall 32 of the case and having a numerical display 34 at the top thereof. The cover 12 has a window 36 therein above the counter 30 to permit easy viewing of the display 34.

Figure 6:
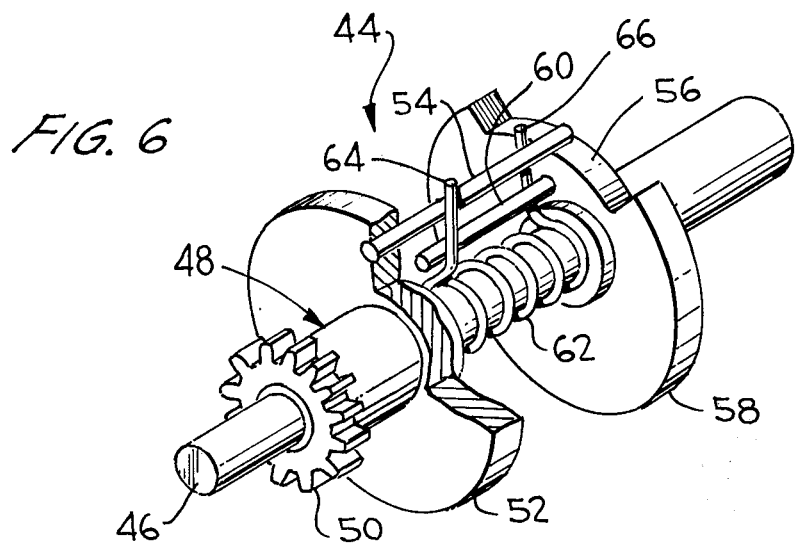
FIG. 6 is a broken perspective of the lost motion mechanism of the jump transfer assembly of the shaft position digitizer of the present invention.
Figure 4:
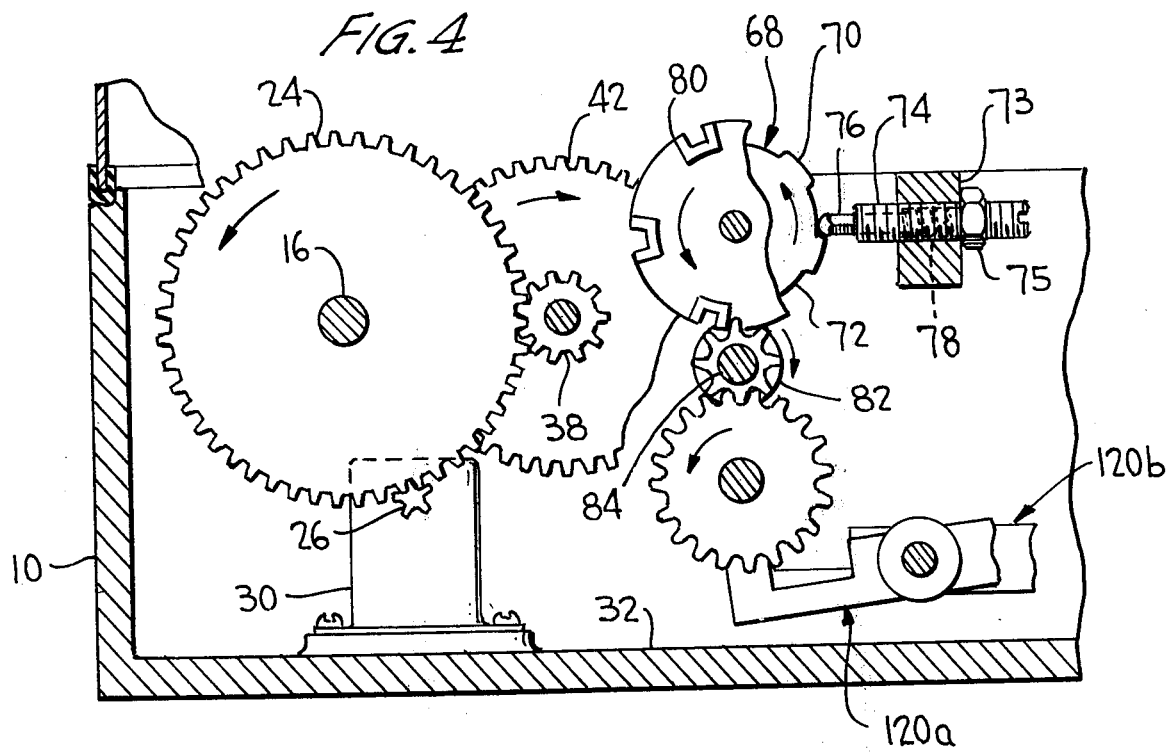
FIG. 4 is a section taken along line 4—4 of FIG. 2.

The gear 24 also meshes with a smaller gear 38 fixed adjacent side wall 18 to a shaft 40 journaled in the side walls 18 and 20, and the shaft 40 carries a larger gear 42 adjacent wall 20 which drives a jump transfer assembly 44 best shown in FIGS. 2, 4 and 6. The jump transfer assembly includes a jump transfer shaft 46 journaled in the side walls 18 and 20 and a lost motion mechanism having a sleeve member 48 freely rotatable thereon adjacent side wall 20. The sleeve member 48 has a portion forming a gear 50 meshing with gear 42, and a blank or plate 52 is fixed to the sleeve 48 to rotate with the gear 50. A pin 54 is secured to blank 52 and extends parallel to the axis of jump transfer shaft 46 to be received in a peripheral recess 56 in a blank or plate 58 fixed to jump transfer shaft 46. A pin 60 is secured to blank 58 and extends toward blank 52 in parallel with pin 54, and a torsion spring 62 is wound around jump transfer shaft 46 and has ends 64 and 66 biased to engage opposite sides of pins 54 and 60. Adjacent side wall 18, the jump transfer assembly 44 includes a detent wheel 68 fixed to jump transfer shaft 46 and having spaced stop portions 70 extending axially therefrom to define recesses 72 peripherally around the cam. A block 73 is mounted on side wall 18 and supports a screw 74 adjustable therein and held in position by a nut 75. A plunger 76 is disposed within screw 74 and is outwardly biased by a spring 78 to engage the periphery of detent wheel 68.

Secured to jump transfer shaft 46 between blank 58 and detent wheel 68 is a five-tooth transfer gear 80 which drives a pinion gear 82 freely rotatably mounted on a shaft 84 disposed directly below jump transfer shaft 46 and fixed to the side walls of case 10. The pinion gear 82 meshes with a gear 86 secured to a tenths cam 88, the gear 86 and the cam 88 being fixed on a shaft 90 journaled in the side walls 18 and 20 of the case directly below jump transfer shaft 46 and shaft 84. Tenths cam 88 has an end member 92 with a single recess 94 in the periphery thereof for receiving a tooth of a transfer gear 96 freely rotatably mounted on shaft 84. The transfer gear 96 meshes with a gear 98 secured to a units cam 100 freely rotatable on shaft 90, and units cam 100 has an end member 101 with a recess 102 in the periphery thereof for receiving a tooth of a transfer gear 104 freely rotatably mounted on shaft 84. A tens cam 106 and a hundreds cam 108 are driven via transfer gears 104 and 110 on shaft 84 and gears 112 and 114 secured thereto in the same manner as the units cam 100 is driven, it being appreciated that the units cam 100, the tens cam 106 and the hundreds cam 108 are all rotatably mounted on shaft 90 and that additional digit cams could be provided using similar transfer structure if desired.

Figure 5:
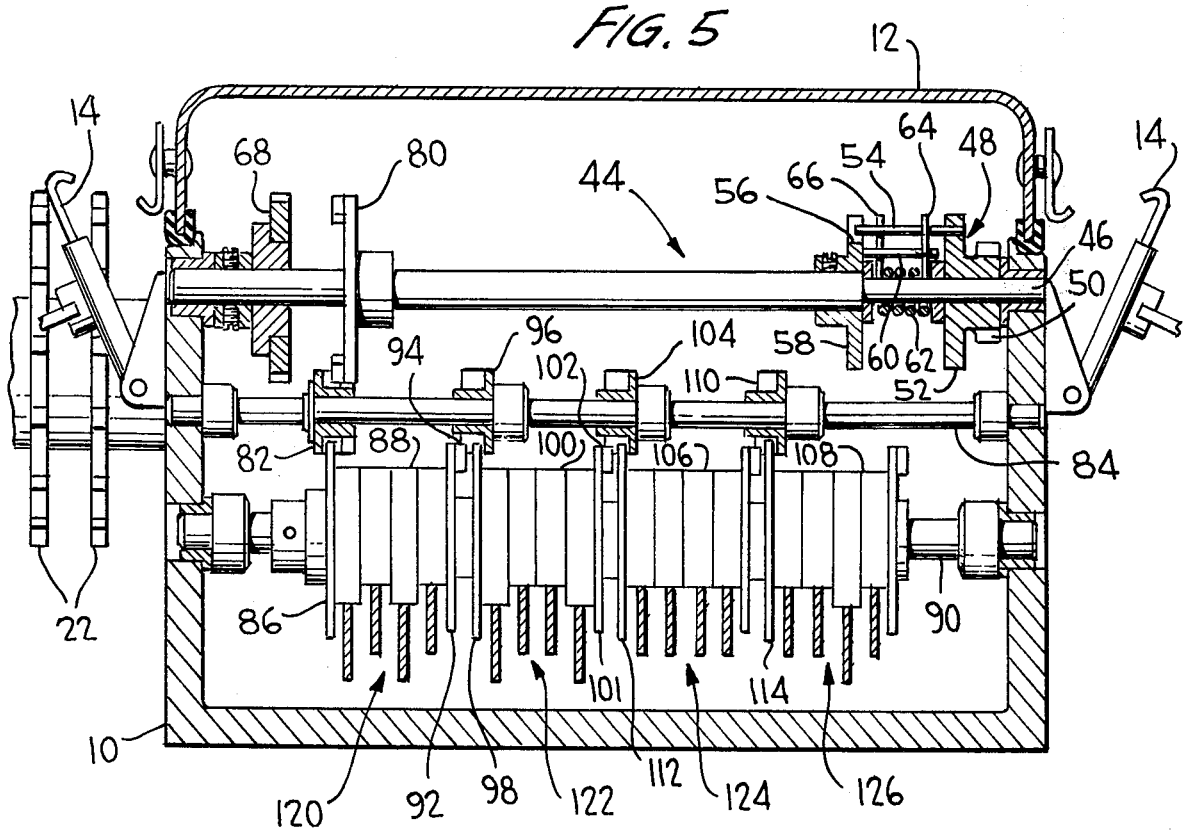
FIG. 5 is a section taken along line 5—5 of FIG. 2.

A shaft 118 is mounted between the side walls of case 10 and pivotally supports in a row a tenths group 120 of four levers 120a, 120b, 120c and 120d, a units group 122 of four levers 122a, 122b, 122c and 122d, a tens group 124 of four levers 124a, 124b, 124c and 124d, and a hundreds group 126 of four levers 126a, 126b, 126c and 126d. All of the levers have the same general configuration and, thus, only lever 124c will be described in detail, as best shown in FIG. 3. Each lever has an L-shaped configuration with a generally horizontal leg 128 pivotally mounted on shaft 118 and a generally vertical leg 130 extending transversely from one end of leg 128, the other end of leg 128 forming a bevelled cam follower 132. The cam follower 132 of each lever is biased against the associated tenths, units, tens or hundreds cam by the weight of the right-hand portion of the lever, looking at FIG. 3, being greater than the weight of the left-hand portion of the lever. Each of the tenths, units, tens and hundreds cams 88, 100, 106 and 108 is divided into four cam portions having cam surfaces for engaging the cam follower ends of the levers in groups 120, 122, 124 and 126, respectively, as best shown in FIG. 5, such that movement of the levers in each group represents a binary coded decimal output. Each of the levers carries a magnet 134 on leg 130, and the magnets are carried at low and high positions alternately as shown in FIG. 3 wherein lever 124c carries a magnet 134 at a low positions and lever 124d carries a magnet 134 at a high position.

A printed circuit board 36 is mounted on the base 32 of case 10 and supports groups of reed switch 138, 140, 142 and 144, each group having four reed switches a, b, c and d therein each aligned with the magnet carried by one of the levers. The reed switches are alternately mounted at low and high positions as shown by reed switches 142c and 142d in FIG. 3 such that the alternating positioning of the magnets combined with the alternating positioning of the reed switches minimizes cross talk and erroneous operation of the reed switches. Also mounted on the printed circuit board 136 are conventional suitable buffer circuitry components 146 for producing electrical BCD outputs on leads 148 to an output plug 150.

In operation, rotation of input shaft 16 drives counter 30 via gears 24 and 26 to provide a visual readout visible through window 36, and shaft 16 also drives the jump transfer assembly 44 via gears 24, 38, 42 and 50. The sleeve member 48 is initially movable without rotation of jump transfer shaft 46 because the force of torsion spring 62 is less than the force required to depress plunger 76 and permit detent wheel 68 to turn. Accordingly, pin 54 will initially be moved to store energy in spring 62; and, once pin 54 engages a side wall of recess 56 in plate 58, the force will be sufficient to depress plunger 76 against the bias of spring 78 thereby permitting stop 70 to pass by the plunger such that the plunger then engages the next recess or detent 72. Once the plunger is released, the stored energy in spring 62 is released to cause a jump advance of jump transfer shaft 46 thereby moving the detent wheel 68 until the next stop 70 is engaged by plunger 76. In this manner, rotation of the detent wheel is resisted and movement of jump transfer shaft is accomplished with discrete jump advances.

Rotation of jump transfer shaft 46 is transmitted to tenths cam 88 via gears 80, 82 and 86, and rotation of cam 88 causes the levers in group 120 to pivot between an operative position where magnet 134 is sufficiently close to a reed switch to cause it to close and an inoperative position where the magnet has been moved away from the reed switch to permit the reed switch to open. The levers in group 120 produce a tenths output via reed switches 138 in a BCD manner, and for each ten counts, units cam 100 will be rotated one step via member 92 and gears 96 and 98 to control the levers in group 122 to provide a units BCD output. In a similar manner, tens and hundreds outputs are produced by cams 106 and 108 and groups of levers 124 and 126.

From the above, it will be appreciated that the shaft position digitizer of the present invention is simple and economical in construction and operates bidirectionally while being in a standby interrogate mode at all times with no least significant digit ambiguity due to the jump transfer assembly. That is, the lost motion, jump transfer drive for the cams assure discrete step by step movement thereby providing an accurate output regardless of the direction of rotation of the input shaft. The configuration of the magnet-carrying levers and the reed switches is structurally simple while providing increased accuracy by eliminating cross-talk due to the vertical staggering of adjacent magnets and reed switches.

Inasmuch as the present invention is subject to many variations, modifications and changes in detail, it is intended that all subject matter described above or shown in the accompanying drawings be interpreted as illustrative and not in a limiting sense.

What is claimed is:

1. A shaft position digitizer comprising:
   a rotatable input shaft,
   magnetically operated reed switch means for providing an electrical digit output representative of rotation of said input shaft,
   magnet means movable to operate said reed switch means,
   means for moving said magnet means which dispose said magnet means in arrangements which are indicative of said input shaft rotation,
   jump transfer means having lost motion means for producing a jump advance of said magnet moving means in response to a predetermined rotation of said input shaft whereby least significant digit ambiguity in said digital output is eliminated, said jump transfer means including a rotatable jump transfer shaft, a plain disk rotatable on said jump transfer shaft by rotation of said input shaft, a further disk fixed to said jump transfer shaft and having a recess therein, a torsion spring having as parts thereof spaced extensions and coiled about said jump transfer shaft disposed between said disks, a torsion spring loading means constituted by a pin fixed to said plain disk and having portions thereof extending between said disks and disposed in said recess, a torsion spring retaining means constituted by a further pin fixed to said recessed disk and extending approximately to said plain disk, and wherein said torsion spring is operatively maintained on said jump transfer shaft between said disks by engagement of said extensions thereof with said pin and said further pin respectively, a jump transfer shaft rotation restraining detent means including a component thereof fixed to said jump transfer shaft and having a plurality of spaced camming elements, and a separately supported plunger means normally biased against said component at between said camming elements so as to resist rotational displacement of said component and of said jump transfer shaft, wherefore said jump advance is produced in response to a rotation of said input shaft and said plain disk therewith which moves said extended portion of said pin to engage said recess and thereby drive said recessed disk together with said jump transfer shaft and said component fixed thereto so as to temporarily interpose a said camming element of said component at said plunger which negates said plunger bias restraint and frees said component for rotation together with said jump transfer shaft and said recessed disk by energy of said torsion spring stored therein prior to a release thereof following displacement of said further pin by said drive to said recessed disk.

2. A shaft position digitizer comprising:

a rotatable input shaft, a plurality of magnetically operated reed switch means for providing an electrical digital output representative of rotation of said input shaft, a plurality of magnet means movable to operate said reed switch means, means for moving said magnet means which dispose said magnet means in arrangements which are indicative of said input shaft rotation, said magnet means moving means being levers on which said magnet means are carried, each said reed switch means being aligned with one of said magnet means, and said magnet means are alternately supported on said levers at low and high positions and said reed switches are correspondingly disposed at low and high positions, jump transfer means having lost motion means for producing a jump advance of said magnet moving means in response to a predetermined rotation of said input shaft whereby least significant digit ambiguity in said digital output is eliminated, said jump transfer means including a rotatable jump transfer shaft, a first member rotatable on said jump transfer shaft by rotation of said input shaft, a second member fixed to said jump transfer shaft and having a recess therein, a torsion spring situated on said jump transfer shaft, a torsion spring loading means fixed to said first means and having an extended part thereof disposed in said recess, a torsion spring retaining means fixed to said second member, and wherein said torsion spring is operatively maintained on said jump transfer shaft between said first member and said second member by engagement with said loading means and said retaining means therefor, a jump transfer shaft rotation restraining detent means including a component thereof fixed to said jump transfer shaft and having a plurality of spaced camming elements, and a separately supported plunger means normally biased against said component at between said camming elements so as to resist rotational displacement of said component and of said jump transfer shaft, wherefore said jump advance is produced in response to a rotation of said input shaft and said first member therewith which moves said extended part to engage said recess and thereby drive said second member together with said jump transfer shaft and said component fixed thereto so as to temporarily interpose a said camming element of said component at said plunger which negates said plunger bias restraint and frees said component for rotation together with said jump transfer shaft and said second member by energy of said torsion spring stored therein prior to a release thereof following displacement of said retaining means therefor by said drive to said second member.

* * * * *